United States Patent
Lin et al.

(10) Patent No.: US 8,803,223 B2
(45) Date of Patent: Aug. 12, 2014

(54) SONOS DEVICE AND METHOD FOR FABRICATING THE SAME

(75) Inventors: Ching-Chang Lin, Taichung (TW);
Kai-Hsiang Chang, Taichung (TW);
Chih-Yuan Wu, Hsinchu County (TW);
Kuang-Wen Liu, Hsinchu County (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 13/609,879

(22) Filed: Sep. 11, 2012

(65) Prior Publication Data

US 2014/0070299 A1   Mar. 13, 2014

(51) Int. Cl.
*H01L 29/792* (2006.01)
*H01L 29/66* (2006.01)
*H01L 27/115* (2006.01)

(52) U.S. Cl.
CPC .... *H01L 27/11563* (2013.01); *H01L 27/11568* (2013.01); *H01L 29/66833* (2013.01); *H01L 29/792* (2013.01)
USPC .......................................... 257/324; 257/325

(58) Field of Classification Search
CPC .................. H01L 27/11563; H01L 27/11568; H01L 29/66833; H01L 29/792
USPC ................................................. 257/324, 325
See application file for complete search history.

(56) References Cited

U.S. PATENT DOCUMENTS

| | | | | |
|---|---|---|---|---|
| 6,639,271 B1* | 10/2003 | Zheng et al. | ... | 257/324 |
| 6,885,072 B1* | 4/2005 | Jeng | ... | 257/412 |
| 7,432,156 B1* | 10/2008 | Lee et al. | ... | 438/260 |
| 7,564,091 B2* | 7/2009 | Lee et al. | ... | 257/314 |
| 2005/0176203 A1* | 8/2005 | Chang et al. | ... | 438/261 |
| 2007/0205459 A1* | 9/2007 | Cho et al. | ... | 257/321 |
| 2008/0061359 A1* | 3/2008 | Lee et al. | ... | 257/324 |
| 2008/0213963 A1* | 9/2008 | Shih | ... | 438/287 |
| 2008/0315290 A1* | 12/2008 | Lee et al. | ... | 257/321 |
| 2010/0025752 A1* | 2/2010 | Dong | ... | 257/324 |
| 2011/0140191 A1 | 6/2011 | Fumitake | | |
| 2011/0140192 A1* | 6/2011 | Fumitake | ... | 257/324 |
| 2011/0156123 A1* | 6/2011 | Fumitake | ... | 257/315 |
| 2012/0202329 A1* | 8/2012 | Dong | ... | 438/287 |
| 2013/0001682 A1* | 1/2013 | Tang et al. | ... | 257/331 |
| 2013/0078794 A1* | 3/2013 | Dong | ... | 438/591 |
| 2013/0134497 A1* | 5/2013 | Yan et al. | ... | 257/324 |

* cited by examiner

*Primary Examiner* — Ngan Ngo
(74) *Attorney, Agent, or Firm* — Alston & Bird LLP

(57) ABSTRACT

An improved semiconductor device is provided whereby the semiconductor device is defined by a layered structure comprising a first dielectric layer, a data storage material disposed on the first dielectric layer, and a second dielectric layer disposed on the data storage material, the layered structured substantially forming the outer later of the semiconductor device. For example, the semiconductor device may be a SONOS structure having an oxide-nitride-oxide (ONO) film that substantially surrounds the SONOS structure. The invention also provides methods for fabricating the semiconductor device and the SONOS structure of the invention.

14 Claims, 10 Drawing Sheets

SONOS DEVICE AND METHOD FOR FABRICATING THE SAME

TECHNOLOGICAL FIELD

Embodiments of the present invention relate generally to a semiconductor device, in particular, a memory device and a method of fabricating such a device.

BACKGROUND

Non-volatile memory technology is marked by continued efforts to produce smaller memory cells and higher capacity memory devices. Conventionally, much of the development has been focused on developing floating gate flash memory devices, but the drive to develop even smaller memory cells is somewhat hindered by floating gate structures. For example, as the size of the tunnel oxide film present in floating gate memory structures is further reduced, the structure becomes more susceptible to leakage current, which will result in the loss of charges in the floating gate.

In an effort to overcome the limitations imposed by floating gate flash memory structures in further reducing the size of memory cells, flash memories utilizing oxide nitride oxide (ONO) films, such as, for example, in metal oxide nitride oxide silicon (MONOS) and silicon oxide nitride oxide silicon (SONOS) structures, have been developed. Charges accumulate in the silicon nitride film layer, otherwise known as the trap layer, of the ONO film. The use of the ONO film helps to alleviate the possibility of charge loss in the tunnel oxide layer.

FIG. 1 illustrates a conventional memory structure having an ONO film. The SONOS structure 1 of FIG. 1 having a substrate 10 and an ONO film 20 disposed thereupon. The ONO film 20 comprises a silicon nitride layer 40 surrounded by a lower oxide layer 30 and an upper oxide layer 50. A conductive layer 60 representative of a control gate structure is disposed on the ONO film 20. A hard mask (HM) layer 70 may be deposited over the conductive layer 60.

In operation, the SONOS structure 1 may be part of a channel 80 in the substrate 10 having a source side 90 and a drain side 100. Electrons in the channel 80 may gain enough energy to overcome the dielectric barrier imposed by the lower oxide layer 30 and become trapped in the silicon nitride layer 40. The silicon nitride layer 40, itself being non-conductive, is capable of holding a source side charge 110 that will not migrate through the layer proximate to the source side 90 and a drain side charge 120 that will not migrate through the layer proximate to the drain side 100. Therefore, the SONOS structure 1 having the characteristic that it is capable of holding two bits of information.

The presence or absence of a charge in the source side charge 110 and the drain side charge 120 is determined by sensing the change in their threshold voltages upon application of a read voltage. If either the source side charge 110 or the drain side charge 120 does indeed hold a charge, then the threshold voltage will increase upon application of the read voltage. However, the source side charge 110 and drain side charge 120 may interact depending upon the extent of threshold voltage experienced during a read operation. Any resulting interaction is known as a second bit effect.

For example, if both the source side charge 110 and the drain side charge 120 have low threshold voltages, then any interaction between the source side charge 110 and the drain side charge 120 may be avoided by simply selecting a lower read voltage. However, if, for example, the drain side charge 120 has a high threshold voltage and the source side charge 110 has a low threshold voltage, then as the threshold voltage of the drain side charge 120 further increases upon application of the read voltage, the higher threshold voltage of the drain side charge 120 may cause the source side charge 110 to also be incorrectly read as possessing a charge.

While this second bit effect has conventionally been overcome by increasing the drain voltage and/or decreasing the doping concentration of the substrate, both of these solutions each have their own limitations. Increasing the drain voltage reduces the voltage difference that may be experienced between the source side charge 110 and the drain side charge 120, but as the size of these memory devices becomes further reduced, higher a higher drain voltage increases the potential for current drain leakage.

Low substrate doping concentration may lead to unacceptable punch through behavior, which may result in a reduction in the length of the channel resulting in a short channel effect. The short channel effect may cause the erroneous registering of an off state or an on state in the transistor.

There remains a need in the art for improved ONO memory cell structures that overcomes the second bit effect commonly experienced by such structures.

FIG. 2A illustrates a SONOS structure fabricated according to certain conventional manufacturing techniques. As shown in FIG. 2A a residual layer 130, which is an artifact of an etching process of the conventional manufacturing technique, substantially surrounds the sidewall of the SONOS memory cell. The residual layer 130 may possess conductive properties.

As shown in FIG. 2B a particle 140, which more typically remains after an ion implantation process of the conventional manufacturing technique, becomes deposited in a dielectric material surrounding the SONOS memory cell.

BRIEF SUMMARY OF EXEMPLARY EMBODIMENTS

Figure 1:
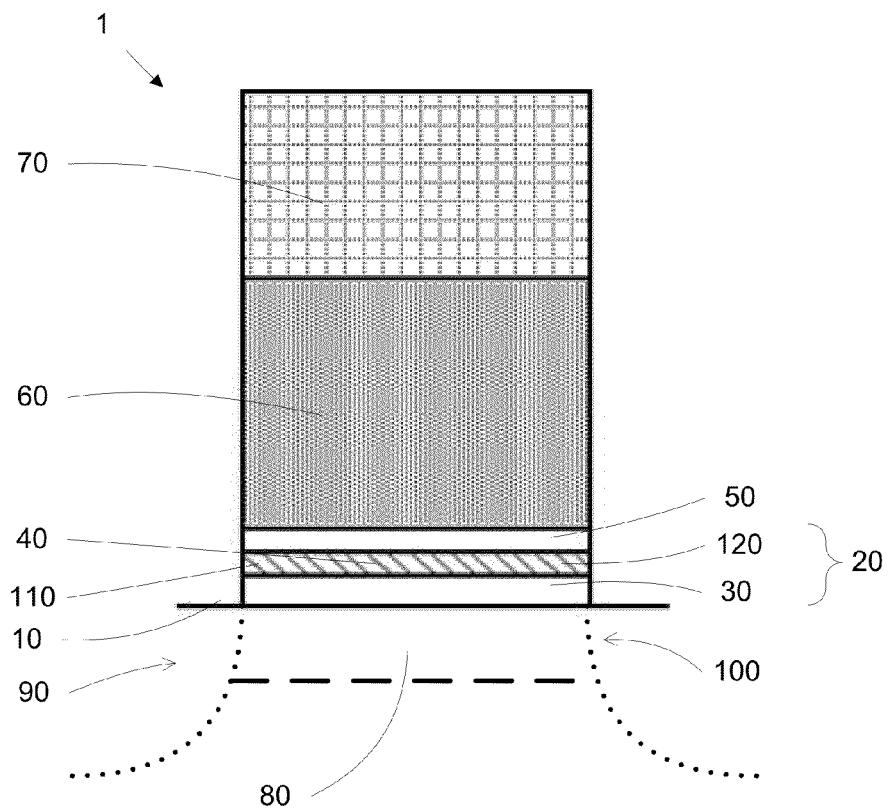

Embodiments of the present invention provide semiconductor devices, in particular, a SONOS structure for use in semiconductor devices.

An aspect of the invention comprises a semiconductor comprising a substrate; a dielectric layer disposed on the substrate, the dielectric layer having an undercut region; a conductive layer disposed on the dielectric layer, the conductive layer having a sidewall; and a charge trapping film that substantially surrounds the dielectric layer and the sidewall of the conductive layer.

According to certain embodiments of the invention, the charge trapping film may comprise a first dielectric layer conformally applied to a sidewall of the gate layer and a surface of the undercut region; a data storage material disposed on the second dielectric layer and applied to fill the undercut region to define a fill region; and a second dielectric layer disposed on the data storage material.

According to an embodiment of the invention, the semiconductor may additionally comprise a channel region disposed in the substrate. The channel region has a length defined from a source side to a drain side. In certain embodiments of the invention, the length of the channel region is greater than a length of the conductive layer. In certain embodiments of the invention, the first dielectric layer may be an oxide/nitride/oxide ("ONO") layer.

In an embodiment of the invention, a cross section of the undercut region is substantially trapezoidal in shape. Further pursuant to this embodiment, the fill region may be substantially parabolic in shape. The undercut region may have a length of approximately 10 nm to approximately 200 nm. In certain embodiments of the invention, the length of the undercut region may be about 100 nm.

The first dielectric layer may have a thickness from about 1 nm to about 10 nm. In certain embodiments of the invention, the thickness of the first dielectric layer is about 5 nm. A thickness of the data storage material proximate to the sidewall of the conductive layer may be from about 0 nm to about 4 nm, or, alternatively, from just above 0 nm to about 4 nm. In certain embodiments of the invention, the thickness of the data storage material at the sidewall is about 1 nm.

A penetration depth of the fill region is defined as the distance from the sidewall to the furthest point inward of the fill region and may be from about 0 nm to about 100 nm, or, alternatively, from just above 0 nm to about 100 nm. In certain embodiments of the invention, the penetration depth of the fill region may be about 50 nm.

An aspect of the invention also provides a method for fabricating a semiconductor device comprising the steps of providing a patterned cell having a dielectric layer, a conductive layer, and a hard mask layer; etching to form an undercut region in the dielectric layer; and forming a charge trapping film that substantially surrounds a sidewall of the patterned cell and an outer exposed portion of the dielectric layer According to certain embodiments of the invention, the step of forming a charge trapping film comprises the steps of forming a first dielectric layer conformally along a sidewall of the patterned cell and a surface of the undercut region; depositing a data storage material on the first dielectric layer; substantially filling the undercut region to define a fill region; and forming a second dielectric layer on the data storage material.

In certain embodiments of the invention, the first dielectric layer may be applied such that it is stepped and rounded at the tunnel oxide region of the semiconductor device. In yet other embodiments of the invention, the depositing and substantially filling steps may be performed at substantially about the same time.

In certain embodiments of the invention, the data storage material is a nitride layer and the step of forming the second dielectric layer may comprise growing an oxide layer on the nitride layer, for example, by thermal oxidation of a portion of the nitride layer.

Another aspect of the invention further comprises a product fabricated from the methods of embodiments of the invention.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING(S)

Figure 2A:
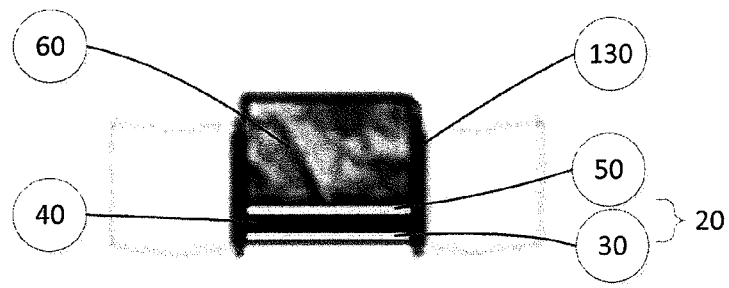
FIG. 2B illustrates a SONOS structure fabricated according to certain conventional manufacturing techniques.
FIG. 2C illustrates how current leakage paths may develop in memory devices having a residual layer 130 or a deposited particle 140. While there have been technological improvements to the manufacturing processes for fabricating SONOS memory cells, there remains a need in the art for a SONOS structure whose design discourages the development of current leakage paths.
Figure 2B:
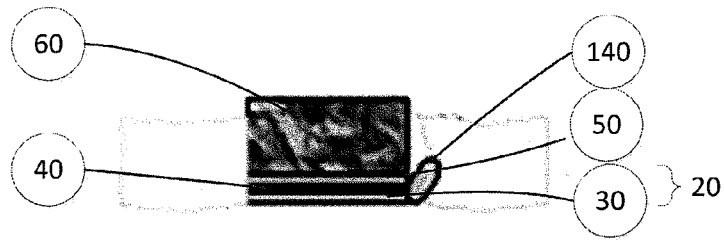
Figure 2C:
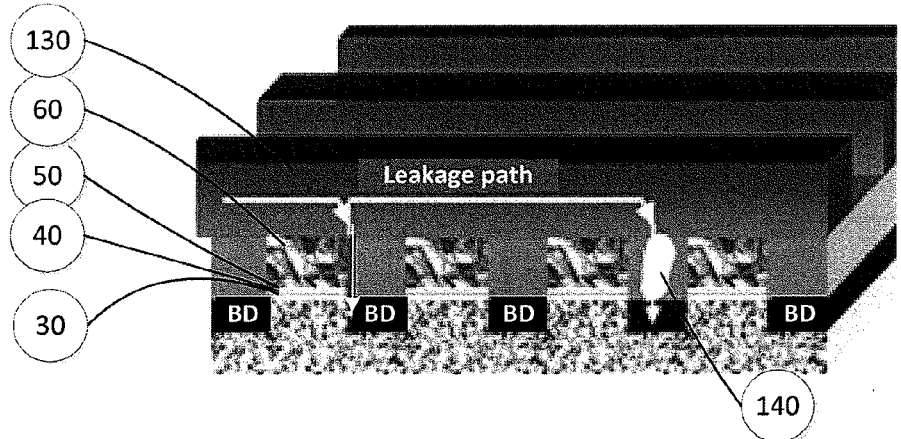
Figure 3:
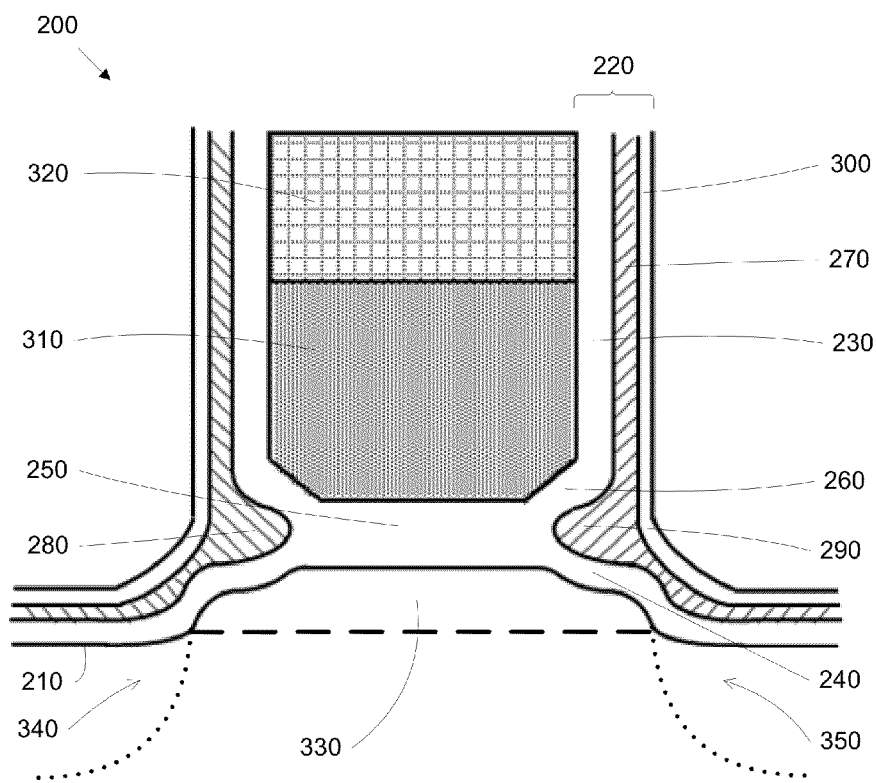
Figure 4A:
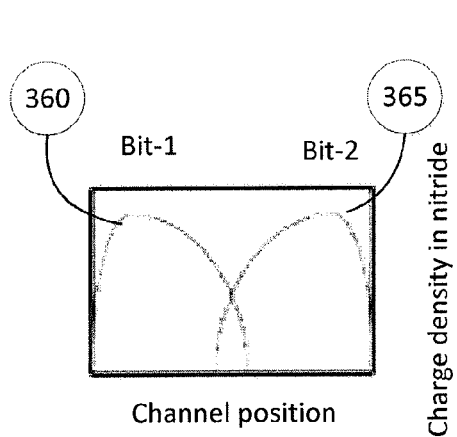
Figure 4B:
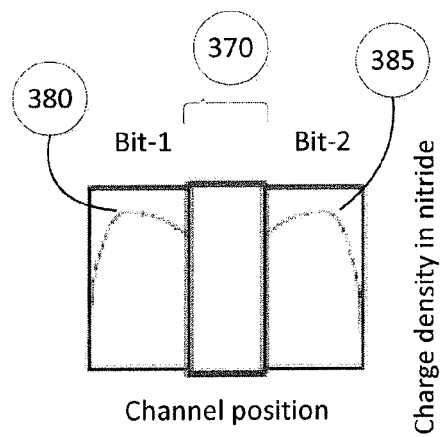
Figure 4C:
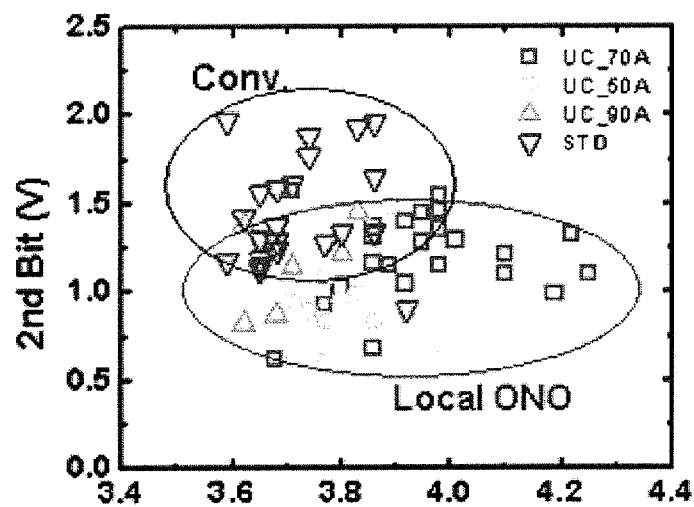
Figure 5A:
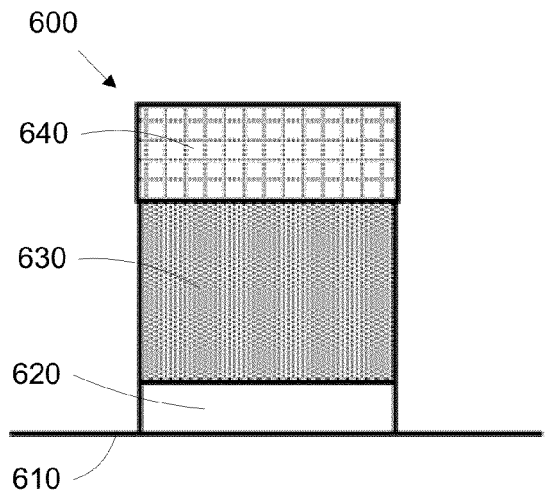
Figure 5B:
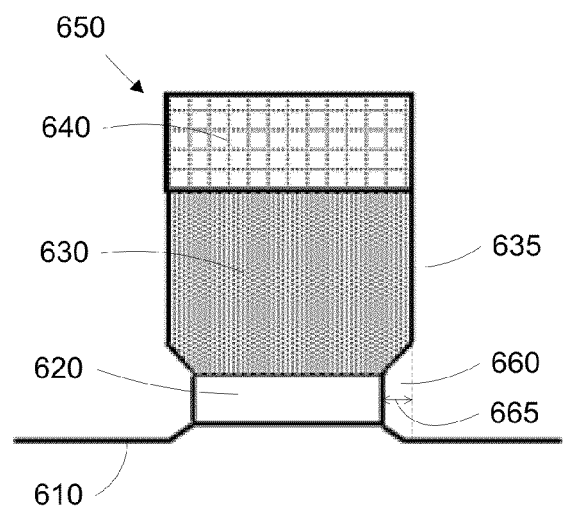
Figure 5C:
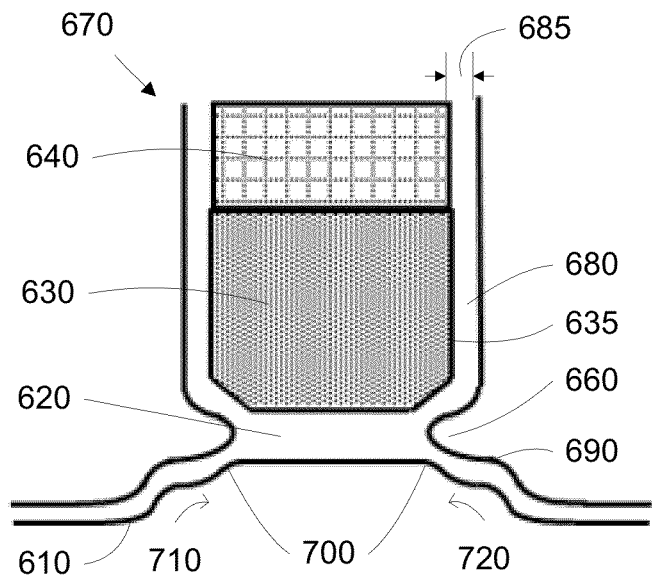
Figure 5D:
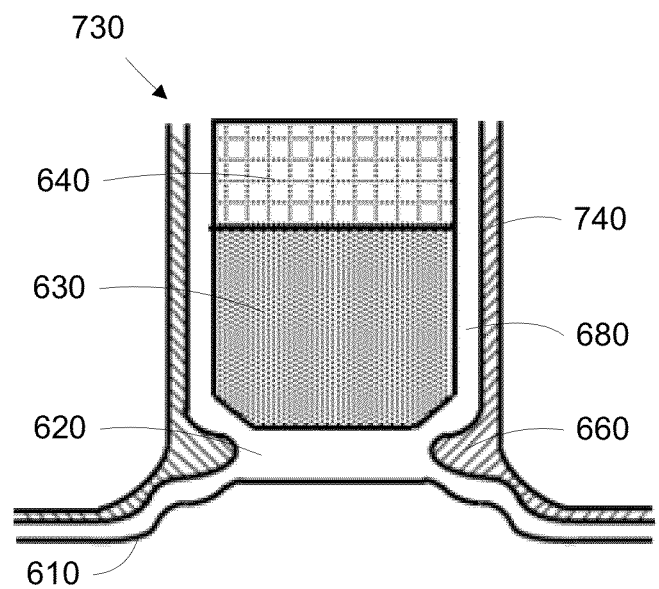
Figure 5E:
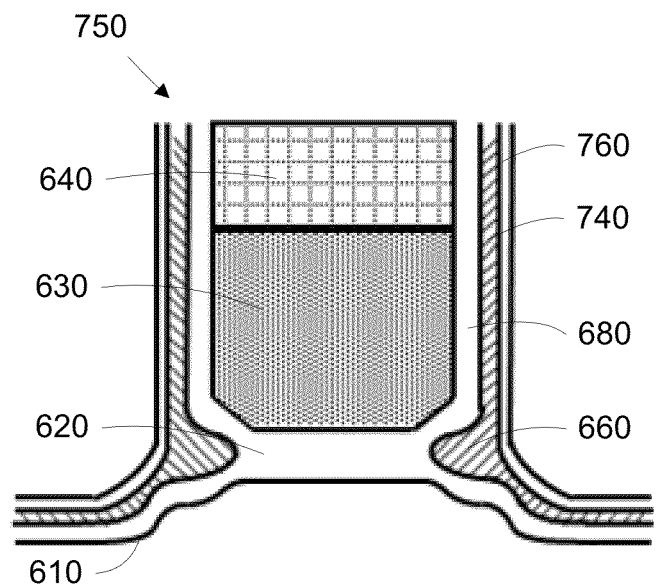
Figure 6:
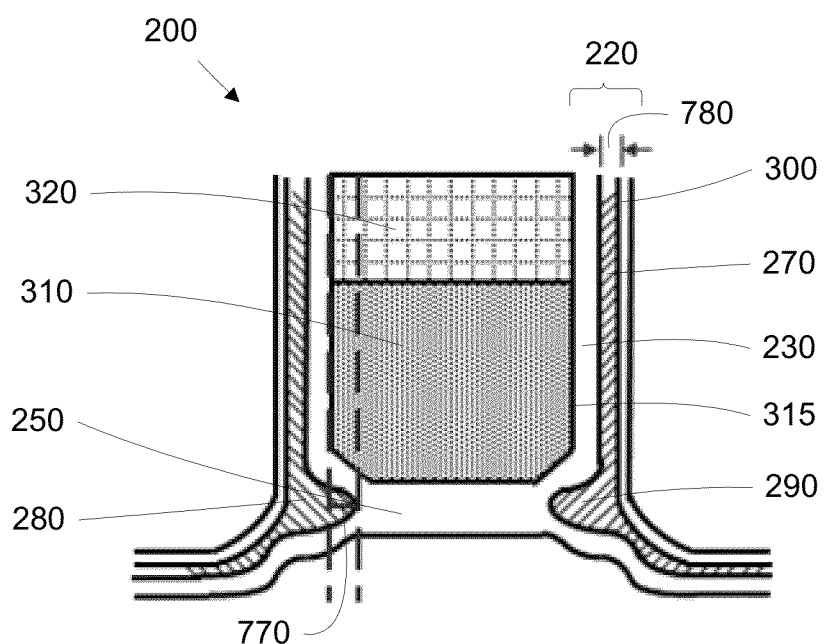
Figure 7:
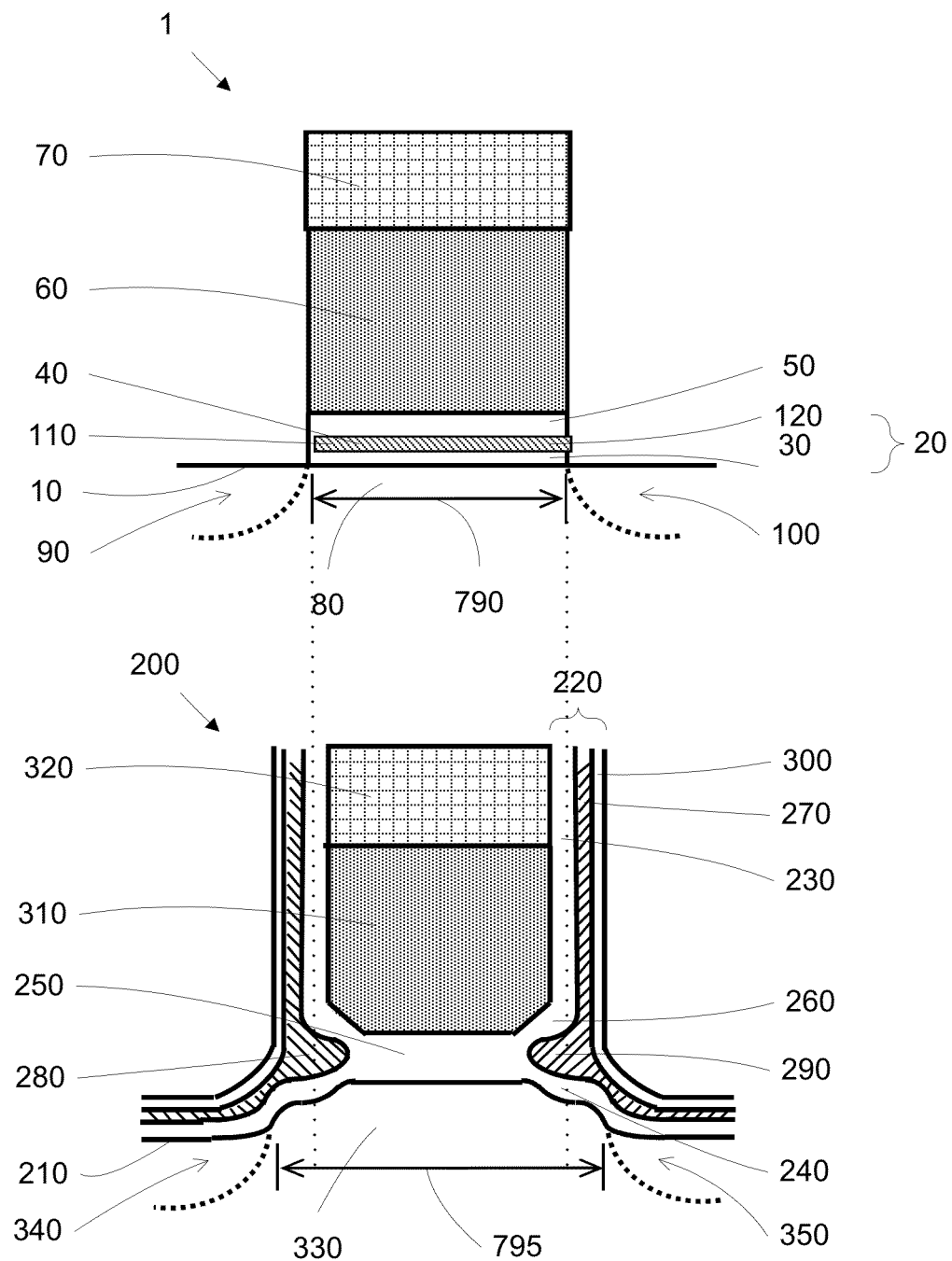
Figure 8:
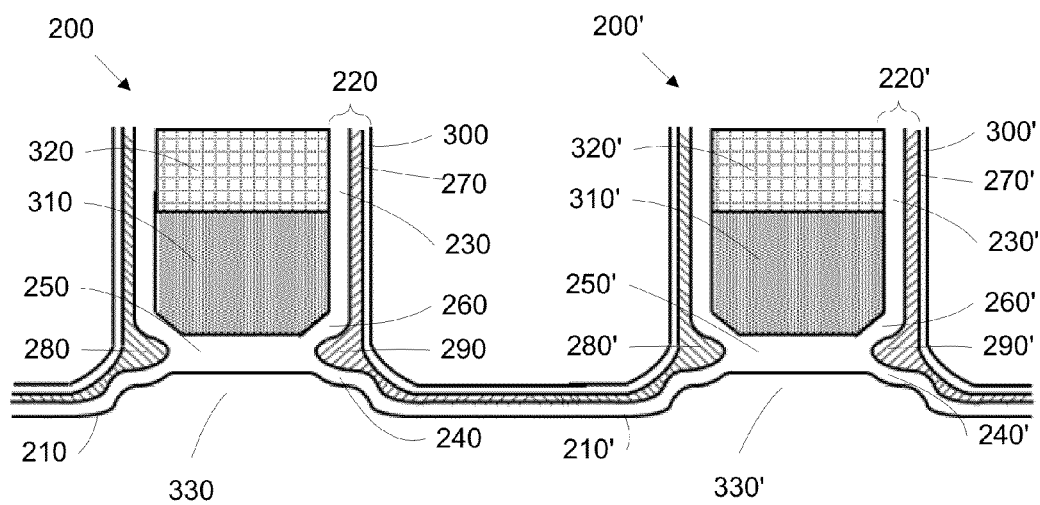
Figure 9:
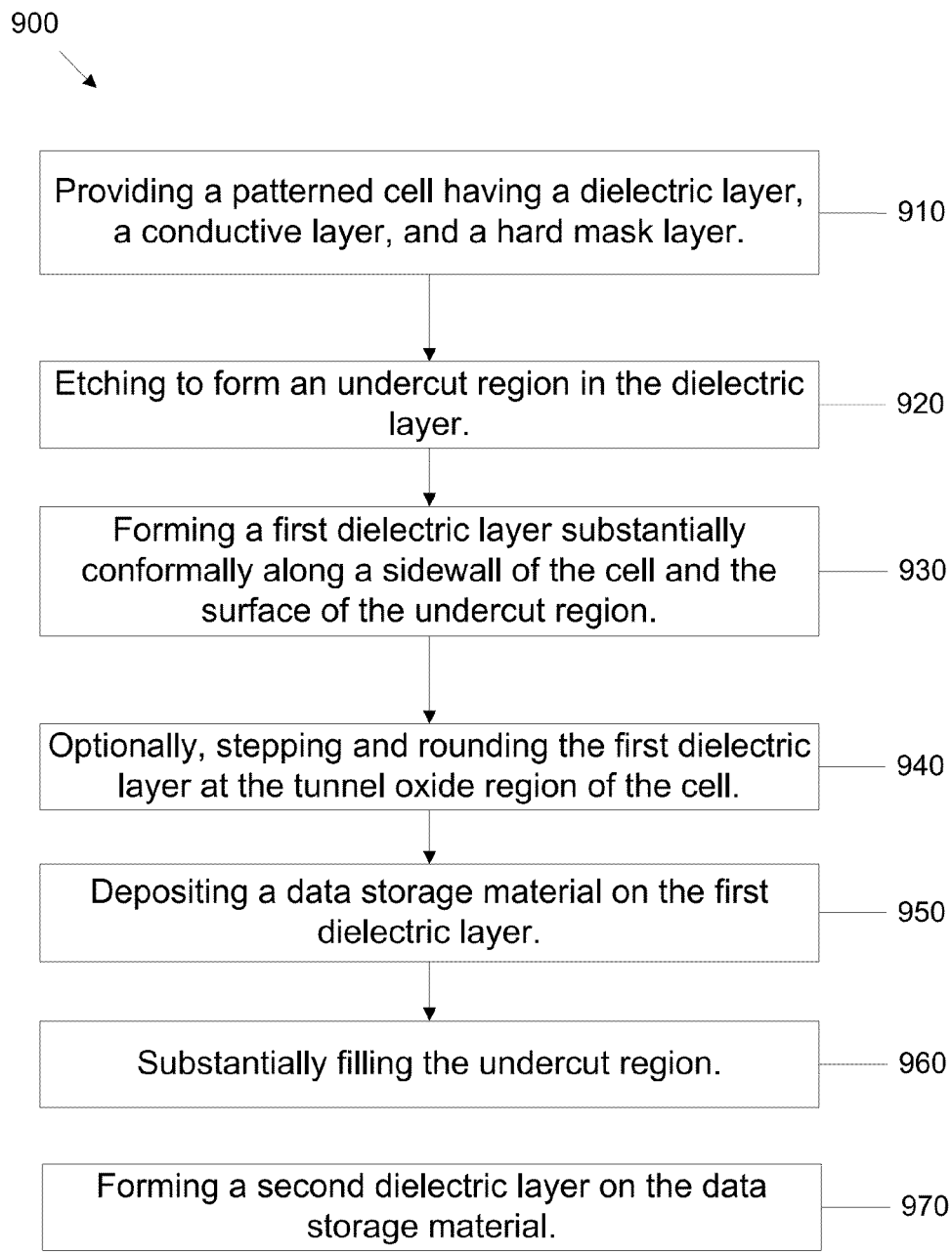

Having thus described the invention in general terms, reference will now be made to the accompanying drawings, which are not necessarily drawn to scale, and wherein:

FIG. 1 illustrates a cross section of a conventional SONOS memory cell;

FIG. 2A illustrates a cross section of a SONOS memory cell fabricated according to a conventional manufacturing technique;

FIG. 2B illustrates a cross section of a SONOS memory cell fabricated according to a conventional manufacturing technique;

FIG. 2C illustrates a cross section of a plurality of SONOS memory cells fabricated according to a conventional manufacturing technique;

FIG. 3 illustrates a cross section of a SONOS memory cell according to an embodiment of the invention;

FIG. 4A is a graph illustrating the variation in charge density in the nitride layer versus channel position for a conventional SONOS memory cell;

FIG. 4B is a graph illustrating the variation in charge density in the nitride layer versus channel position for a SONOS memory cell according to an embodiment of the invention;

FIG. 4C illustrates the required program voltages of the second bit for a conventional SONOS memory cells and SONOS memory cells according to certain embodiments of the invention;

FIG. 5A illustrates a cross section of a patterned cell according to an embodiment of the invention;

FIG. 5B illustrates a cross section of a patterned cell having a trapezoidal shaped undercut region according to an embodiment of the invention;

FIG. 5C illustrates a cross section a patterned cell after an inner oxide layer has been formed surrounding the cell according to an embodiment of the invention;

FIG. 5D illustrates a cross section of a patterned cell after a nitride layer has been deposited on the cell according to an embodiment of the invention;

FIG. 5E illustrates a cross section of a patterned cell after an outer oxide layer has been applied to the cell according to an embodiment of the invention;

FIG. 6 illustrates a cross section of a SONOS memory cell according to an embodiment of the invention;

FIG. 7 illustrates a cross section of a conventional SONOS memory cell and a cross section of a SONOS memory cell according to an embodiment of the invention;

FIG. 8 illustrates a cross section a plurality of SONOS memory cells according to an embodiment of the invention; and FIG. 9 is a flowchart illustrating a process for fabricating a SONOS structure according to an embodiment of the invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a SONOS structure" includes a plurality of such SONOS structures.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, "SONOS structure" refers to a component of a semiconductor device, such as a memory device. Non-limiting examples of memory devices include flash memory devices. Erasable programmable read-only memory (EPROM) and electrically erasable read-only memory (EE-PROM) devices are non-limiting examples of flash memory devices. The SONOS structures of the invention may be a SONOS structure assembly capable of operating in memory devices or a sub-assembly of a component or components of such gate structures.

A SONOS structure generally may include a substrate, an ONO film, and a conductive layer. A plurality of these SONOS structure representations in a memory device is used to identify information, such as information that is needed by a processing system. A component of a SONOS structure includes a nitride layer that is configured to hold two bits of information each having a threshold voltage.

The SONOS structure of the invention and methods of manufacturing such devices results in a SONOS structure that reduces or eliminates the second bit effect that may otherwise be experienced by such devices. Additionally, the SONOS structure of the invention and methods of manufacturing such devices results in a SONOS structure that reduces or eliminates the short channel effect that may otherwise be experienced in such devices. Further, the SONOS structure of the invention prevents the development of current leakage paths that otherwise develop in memory devices.

Generally, the semiconductor device of the invention has a stack structure substantially surrounded by a charge trapping film. The semiconductor device has a substrate upon which the stack structure is disposed. In certain embodiments of the invention, the stack structure may comprise a dielectric layer and a conductive layer. In an embodiment of the invention, the dielectric layer has an undercut region.

In certain embodiments of the invention, the charge trapping film may comprise a first dielectric layer conformally applied to a sidewall of the conductive layer and a surface of the undercut region. The charge trapping film, in certain embodiments of the invention, may additional comprise a data storage material that may be disposed on the first dielectric layer and applied to fill the undercut region to define a fill region. In certain embodiments of the invention, the charge trapping film may comprise a second dielectric layer substantially disposed on the data storage material.

FIG. 3 illustrates a cross section of a SONOS memory cell according to an embodiment of the invention. The SONOS structure 200 having a substrate 210 and an oxide nitride oxide (ONO) film 220. The ONO film 220 comprises in inner oxide layer 230, a nitride layer 270, and 300. The inner oxide layer 230 surrounds a conductive layer 310 operating as a gate and an optional hard mask layer 320. In addition to generally operating as a dielectric layer, the inner oxide layer 230 includes regions that function as a tunnel oxide layer 240, an outer layer for a gate dielectric layer 250, and a top dielectric layer 260. The gate dielectric layer 250, for example, may itself may be an oxide layer or any other material or material combinations that can be used as a gate dielectric layer 250 as known in the art.

The nitride layer 270 substantially surrounds the inner oxide layer 230 and also fills a continuous undercut region that is shown by a source side charge region 280 and a drain side charge region 290 in FIG. 3. The substrate 210 may have defined a channel 330, as shown in the exemplary embodiment of FIG. 3, having a source side 340 and a drain side 350. The source side charge region 280 of the nitride layer 270 corresponds to a charge trap layer for the source side 340, and the drain side charge region 290 of the nitride layer 270 corresponds to a charge trap layer for the drain side 350.

Without intending to be bound by the theory, the gate dielectric 250 provides a well-defined dielectric barrier between the source side charge region 280 and the drain side charge region 290 that works, inter alia, to substantially reduce, if not eliminate altogether, the second bit effect of the SONOS structure 200. For example, FIG. 4A is a graph illustrating the variation in charge density in the nitride layer versus channel position for a conventional SONOS memory cell. The charge density for bit-2 365, the drain side bit, tends to interfere with the charge density of bit-1 360, the source side bit, particularly at lower threshold voltages. FIG. 4B is a graph illustrating the variation in charge density in the nitride layer versus channel position for a SONOS memory cell according to an embodiment of the invention. As shown in FIG. 4B, the gate dielectric layer 250, provides a buffer region 370 between the charge density of bit-1 380 and the charge density of bit-2 385.

FIG. 4C illustrates the reduction that is possible in program voltage levels for the lower second bit of SONOS memory cells in certain embodiments of the invention versus the higher second bit in conventional SONOS memory cells.

The invention further provides a preferred shape for the undercut etched region of the SONOS structure. In certain embodiments of the invention, a cross section of the undercut region is substantially trapezoidal in shape. In certain embodiments of the invention, a fill region of the undercut region is substantially parabolic in shape.

FIGS. 5A-5E illustrate the cross sectional views of a cell after various steps of fabricating a SONOS structure to provide a filled undercut region according to an embodiment of the invention. FIG. 5A illustrates a cross section of a patterned cell 600 having a dielectric layer 620, a conductive layer 630, and a hard mask layer 640 disposed upon a substrate 610 according to an embodiment of the invention.

FIG. 5B illustrates a cross section of a patterned cell 650 having an undercut region 660 surrounding the dielectric layer 620 according to an embodiment of the invention. As shown in FIG. 5B, the undercut region 660 approximates a trapezoidal shape in appearance as it surrounds the dielectric layer 620. The undercut region 660 of FIG. 5B is formed using a special undercut etching procedure that allows the undercut region 660 to have substantially a trapezoidal shape.

In an embodiment of the invention, a distance 665 of the undercut region 660 from a sidewall 635 of the conductive layer 630 and the deepest penetration point at the dielectric layer 620, otherwise known as the altitude or height of the trapezoid region between the longest base and the shortest base of the trapezoid shape, is anywhere in a range of from about 10 nm to about 200 nm. In certain embodiments of the invention, the distance 665 may be about 100 nm.

The trapezoidal shape of the undercut edge region 660 allows the shape of the source side charge region 280 and the drain side charge region 290 as shown in FIG. 3 to be formed once the cell is subjected to additional processing as further described herein. The source side charge region 280 and the drain side charge region 290, according to an embodiment of the invention, have a substantially parabolic shape that increases in size until meeting about at the points where the inner oxide layer 230 forms the tunnel oxide layer 240 at the bottom of the source side charge region 280 and the drain side charge region 290 and where the inner oxide layer 230 forms the top dielectric layer 260 at the top of the source side charge region 280 and the drain side charge region 290.

FIG. 5C illustrates a cross section of a patterned cell 670 having a trapezoidal shaped undercut region 660 with an inner oxide layer 680 that has been substantially conformally applied to the sidewall of the patterned cell 670 and to the surfaces of the undercut region 660 according to an embodiment of the invention.

For example, the inner oxide layer 680 may be deposited along the sidewall of the patterned cell 670 and to the surfaces of the undercut region 660 using any deposition technique known in the art. In certain embodiments of the invention, the inner oxide layer 680 will be thermally grown along the side wall of the patterned cell 670 and to the surfaces of the undercut region 660. Indeed any technique known for forming the lower oxide layer known in the art may be used to form the inner oxide layer 680.

In certain embodiments of the invention, the inner oxide layer may correspond, for example, to a tunnel/top oxide dielectric layer. In certain embodiments of the invention, the inner oxide layer may be formed by an oxide/nitride/oxide ("ONO") film layer. In certain embodiments of the invention, a thin silicon nitride layer may be applied to the tunnel/top oxide for suppressing the gate electrode and substrate encroachment resulting from the oxidation and silicon nitride thermal processes. The thin silicon nitride layer may then be converted to a silicon-oxy-nitride (SiOxN) layer by thermal oxidation.

In an embodiment of the invention, the inner oxide layer 680 has an inner oxide layer thickness 685 extending from the sidewall 635 of about 1 nm to about 10 nm. In an embodiment of the invention, the inner oxide layer thickness 685 may be about 5 nm.

The inner oxide layer may be stepped and rounded 690 to better define the channel region 700, the source side region 710, and the drain side region 720. Without intending to be bound by the theory, such configurations may provide improved programmability, erasability, and read capability.

FIG. 5D illustrates a cross section of a patterned cell 730 after the nitride layer 740 has been deposited to the inner oxide layer 680 according to an embodiment of the invention. As further shown in FIG. 5D, a void region 490 is avoided as a result of the trapezoidal undercut region 660 of the invention.

FIG. 5E illustrates a cross section of a patterned cell 750 following the formation of an outer oxide layer 760. Indeed, the patterned cell 750 of FIG. 5E resulting in the finished SONOS structure 200 further described in FIG. 3 and FIG. 6 with the exception that the SONOS structure 200 may have undergone additional processing steps, for example, doping, etching, polishing, etc.

According to FIG. 6, the SONOS structure 200 is defined by a penetration depth 770, which is the distance from a sidewall 315 of the conductive layer 310 to the point where the material of the nitride layer 270 meets the inner oxide layer 230 at the deepest point where the inner oxide layer contacts the gate dielectric layer 250. According to an embodiment of the invention, the penetration depth 770 is anywhere in a range of from about 0 nm (i.e., no penetration beyond the sidewall 315) to about 100 nm. In certain embodiments of the invention, the penetration depth 770 is about 50 nm.

Additionally, as show in FIG. 6, the SONOS structure 200 is further defined by a nitride layer thickness 780 of the nitride layer 270 between the inner oxide layer 230 and the outer oxide layer 300 proximate to the sidewall 315 of the conductive layer 310 and the hard mask layer 320. According to an embodiment of the invention, the nitride layer thickness 780 may be about 0 nm to about 4 nm, or, alternatively, just above 0 nm to about 4 nm. In certain embodiments of the invention, the nitride layer thickness may be about 1 nm.

FIG. 7 illustrates the cross section of a conventional SONOS memory cell 1 as also shown in FIG. 1 compared to the cross section of a SONOS memory cell 200 according to an embodiment of the invention also shown in FIG. 3. The conventional SONOS memory cell 1 has a conventional channel length 790 while the SONOS memory cell 200 according to an embodiment of the invention has a channel length 795. As shown in FIG. 7, the channel length 795 of the SONOS device 200 according to an embodiment of the invention is greater than the conventional channel length 790. In certain embodiments of the invention, the channel length 795 exceeds the length of the conductive layer 310 by at least about 5%, by at least about 10%, by at least about 20%, by at least about 25%, and by at least about 50%.

Without intending to be bound by theory, the increase in channel length 795 of the SONOS memory cell 200 of the invention leads to improved short channel effect performance and a greater punch voltage between the source side 340 and the drain side 350. In certain embodiments of the invention, the channel length 795 is greater than the length of the conductive layer 310 that, in certain embodiments of the invention, may be the control gate.

Generally, the source and drain regions of the substrates of both the conventional SONOS memory cell and the SONOS memory cell of the invention will be implanted with ions to favorably alter the electrical properties of these regions. Any implantation process known in the use may be used to implant the source regions and the drain regions.

According to an embodiment of the invention, the channel length 795 is about 40% greater than the conventional channel length 790. In certain embodiments of the invention, the punch voltage of the SONOS device 200 of the invention is about 33% greater than a conventional SONOS device 1.

FIG. 8 illustrates a cross section two SONOS memory cells according to an embodiment of the invention. FIG. 8 provides an exemplary embodiment when more than one SONOS memory cell of the invention is configured for use in a memory device. As shown in the exemplary embodiment of FIG. 8 the inner oxide layer 230 & 230', the nitride layer 270 & 270', and the outer oxide layer 300 & 300' form a continuous connective ONO layer between each of the SONOS memory cells 200 & 200' according to an embodiment of the invention.

FIG. 9 is a flowchart illustrating a process for fabricating a semiconductor device according to an embodiment of the invention. The process for fabricating a semiconductor device 900 comprises the step of providing a patterned cell having a dielectric layer, a conductive layer, and, optionally, a hard mask layer 910. The conductive layer may be a gate layer as further described herein. An etching step is performed to form an undercut region in the dielectric layer 920. In certain embodiments of the invention, the undercut region has a trapezoidal shape as described herein.

The process for fabricating a semiconductor device 900 generally comprises the step of forming a charge trapping film at a sidewall of the patterned cell. In an embodiment of the invention the step of forming a charge trapping film comprises the additional steps as shown in FIG. 9 that include forming a first dielectric layer, such as an inner oxide layer, substantially conformally along a sidewall of the cell and the surfaces of the undercut region 930. Optionally, the first dielectric layer may be stepped and rounded at the tunnel oxide region of the cell 940. The process for fabricating a semiconductor device 900 also comprises depositing a data storage material such as a nitride layer to the inner oxide layer 950 and substantially filling the undercut region 970. In certain embodiments of the invention, the data storage material is disposed on the first dielectric layer and substantially simultaneously fills the undercut region. In certain other embodiments of the invention, multiple steps may be performed to ensure the undercut region is completely filled.

Finally, a second dielectric layer, such as an oxide layer, may be formed along the nitride layer 970. For example in certain embodiments of the invention the second dielectric layer may be deposited on the data storage material. In certain other embodiments, the second dielectric layer may be grown on the data storage material. In more specific embodiments of the invention, an oxide layer may be grown on a nitride layer by performing a thermal oxidation step converting a portion of the nitride layer into a silicon-oxy-nitride (SiOxN) layer.

An aspect of the invention provides a semiconductor device such as a SONOS structure fabricated according to any method of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A semiconductor device comprising:
    a substrate;
    a dielectric layer disposed on the substrate, the dielectric layer having an undercut region;
    a conductive layer disposed on the dielectric layer, the conductive layer having a sidewall; and
    a charge trapping film substantially surrounding the dielectric layer and the sidewall of the conductive layer, wherein a portion of the substrate and conductive layer are removed to form the undercut region.

2. The semiconductor device of claim 1, wherein the charge trapping film comprising:
    a first dielectric layer conformally applied to the sidewall of the conductive layer and a surface of the undercut region;
    a data storage material disposed on the first dielectric layer and applied to fill the undercut region to define a fill region; and
    a second dielectric layer disposed on the data storage material.

3. The semiconductor device of claim 1, wherein a cross section of the undercut region is substantially trapezoidal in shape.

4. The semiconductor device of claim 3, wherein the undercut region having a length of about 10 nm to about 200 nm.

5. The semiconductor device of claim 4, wherein the length is about 100 nm.

6. The semiconductor device of claim 3, wherein a cross section of the fill region is substantially parabolic in shape.

7. The semiconductor of claim 2 additionally comprising a channel region disposed in the substrate, a length of the channel region from a source side to a drain side is greater than a length of the conductive layer.

8. The semiconductor of claim 2, wherein the first dielectric layer is an oxide/nitride/oxide ("ONO") layer.

9. The semiconductor device of claim 2, wherein the first dielectric layer having a thickness of about 1 nm to about 10 nm.

10. The semiconductor device of claim 2, wherein the data storage material having a thickness proximate to the sidewall of about 0 to about 4 nm.

11. The semiconductor device of claim 10, wherein the thickness is about 1 nm.

12. The semiconductor device of claim 2, wherein the fill region having a penetration depth that is defined as the distance from the sidewall to the furthest point inward of the fill region, the penetration depth is from about 0 nm to about 100 nm.

13. The semiconductor device of claim 12, wherein the penetration depth is about 50 nm.

14. A semiconductor device fabricated according to a method comprising:
    providing a patterned cell having a dielectric layer, a conductive layer, and a hard mask layer;
    etching to form an undercut region in the dielectric layer;
    forming a first dielectric layer conformally along a sidewall of the patterned cell and a surface of the undercut region;
    depositing a data storage material on the first dielectric layer;
    substantially filling the undercut region to define a fill region; and
    forming a second dielectric layer on the data storage material,
    wherein a portion of the conductive layer and substrate are etched to form the undercut region.

* * * * *